United States Patent
Platzer et al.

(10) Patent No.: US 6,458,503 B1
(45) Date of Patent: Oct. 1, 2002

(54) FLUORINATED AROMATIC ACETAL POLYMERS AND PHOTOSENSITIVE COMPOSITIONS CONTAINING SUCH POLYMERS

(75) Inventors: Stephan Platzer, Longmeadow; Paul Perron, Springfield; Melinda Alden, Chicopee, all of MA (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 49 days.

(21) Appl. No.: 09/801,538

(22) Filed: Mar. 8, 2001

(51) Int. Cl.$^7$ .............................. G03F 7/021; C08F 8/00
(52) U.S. Cl. ...................... 430/157; 430/175; 430/176; 525/61
(58) Field of Search ................................ 430/157, 175, 430/176, 302; 525/61

(56) References Cited

U.S. PATENT DOCUMENTS

| | | | |
|---|---|---|---|
| 2,063,631 A | 12/1936 | Schmidt et al. ............... | 260/2 |
| 2,667,415 A | 1/1954 | Neugebauer et al. ......... | 95/5.4 |
| 2,667,498 A | 1/1954 | Julian et al. ............. | 260/397.4 |
| 2,922,715 A | 1/1960 | Gumbinner .................... | 96/33 |
| 2,946,683 A | 7/1960 | Mellan et al. ................ | 96/75 |
| 3,050,502 A | 8/1962 | Mellan ..................... | 260/72.5 |
| 3,163,633 A | 12/1964 | Steppan et al. ............. | 260/141 |
| 3,227,074 A | 1/1966 | Lareau ....................... | 101/132 |
| 3,311,605 A | 3/1967 | Steppan et al. ............. | 260/141 |
| 3,406,159 A | 10/1968 | Steppan et al. ............. | 260/141 |
| 3,679,419 A | 7/1972 | Gillich .......................... | 96/91 |
| 3,790,382 A | 2/1974 | Dahlman ...................... | 96/75 |
| 3,849,392 A | 11/1974 | Steppan ....................... | 260/141 |
| 3,867,147 A | 2/1975 | Teuscher ...................... | 96/33 |
| 4,126,601 A * | 11/1978 | Cartier ....................... | 428/421 |
| 4,687,727 A | 8/1987 | Toyama et al. ............. | 430/175 |
| 4,845,009 A | 7/1989 | Kita et al. ................... | 430/176 |
| 5,169,897 A | 12/1992 | Walls .......................... | 525/61 |
| 5,219,699 A | 6/1993 | Walls et al. ................ | 430/156 |
| 5,262,270 A | 11/1993 | Walls .......................... | 430/156 |
| 5,275,907 A * | 1/1994 | Walls .......................... | 430/157 |
| 5,316,892 A * | 5/1994 | Walls et al. ................ | 430/157 |
| 5,534,381 A | 7/1996 | Ali et al. .................... | 430/156 |
| 5,698,360 A * | 12/1997 | Timpe et al. ............... | 430/157 |
| 5,700,619 A * | 12/1997 | Baumann et al. ........... | 430/157 |
| 6,087,066 A | 7/2000 | Baumann et al. ......... | 430/270.1 |
| 6,270,938 B1 * | 8/2001 | Gandini et al. ............. | 101/459 |

FOREIGN PATENT DOCUMENTS

EP          909657     4/1999

\* cited by examiner

Primary Examiner—John S. Chu

(74) Attorney, Agent, or Firm—Baker Botts L.L.P.

(57) ABSTRACT

A novel fluorinated aromatic acetal polymer comprises at least one unit of A and at least one unit of B or C, or at least one unit of each of A, B and C and optionally further comprises at least one unit of either D or E or at least one unit of each of D and E, wherein the units A and B and/or C, and optionally D and/or E are linked together by single covalent C—C bonds and have the formulae:

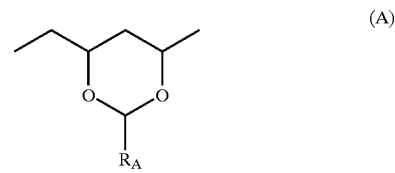

(A)

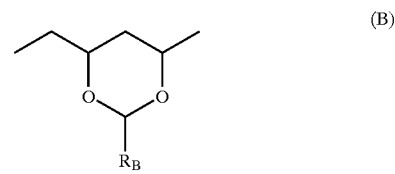

(B)

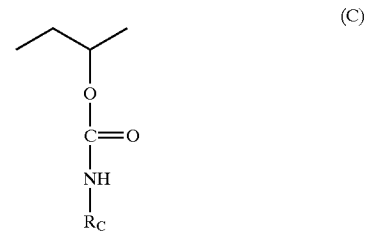

(C)

(D)

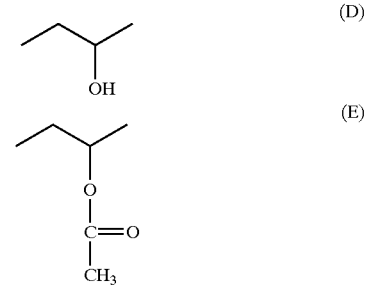

(E)

wherein $R_A$ is H or $C_1$–$C_{11}$ alky, or an aryl group that does not contain fluorine, and $R_B$ and $R_C$ are an aryl groups that contain fluorine. The polymer is prepared by reacting a hydrolyzed polyvinyl acetate polymer or copolymer with at least one non-fluorinated aldehyde component, and at least one fluorinated aromatic component. The polymer is useful is preparing a photosensitive composition which comprises at least one diazo resin and at least one such fluorinated aromatic acetal polymer. Such a photosensitive composition may be applied to a support to form an imageable member which may be imaged to form a lithographic printing plates.p

28 Claims, No Drawings

FLUORINATED AROMATIC ACETAL POLYMERS AND PHOTOSENSITIVE COMPOSITIONS CONTAINING SUCH POLYMERS

BACKGROUND OF INVENTION

1. Field of the Invention

This invention is directed to a fluorinated aromatic acetal polymer composition, a method of preparing such a composition, a photosensitive composition which comprises such a polymer composition and a diazo resin, and imageable members such as lithographic printing plate precursors comprising such a photosensitive composition. After imaging, such a precursor is useful as a lithographic printing plate.

2. Background Information

The use of acetal polymers in photosensitive compositions is well known to those skilled in the art, as disclosed for example in: U.S. Pat. Nos. 5,169,897; 5,219,699; 5,262,270; and 5,534,381. However, although photosensitive compositions containing such acetal polymers have generally performed in an effective manner, improvement in terms of enhanced press life of printing plates containing such compositions is desirable. In addition, enhanced water repellency (to retain high image quality by maximizing hydrophobicity with respect to the hydrophilic portions of the composition) and resistance to plate cleaner solutions (to permit plate cleaning without concurrent reduction in image quality) are desirable.

It is also well known to those skilled in the art that photosensitive compositions comprising a diazonium compound and a polymeric binder may be prepared and used in imageable members such as lithographic printing plates. For example, U.S. Pat. No. 3,790,382 discloses an oleophilic composition suitable for use as the ink-receptive layer of a printing plate, in which the oleophilic composition comprises a light-sensitive diazo resin, a polyamide resin binder, and a polymer containing a non-aromatic fluorinated component. However, in contrast to the photosensitive composition of the present invention, the oleophilic composition disclosed in U.S. Pat. No. 3,790,382 contains a fluoropolymer component which must be non-aromatic.

It has now been found that photosensitive compositions comprising the novel fluorinated aromatic acetal polymers of this invention and at least one diazo resin advantageously provide enhanced press life, water repellency and resistance to plate cleaner solutions when such photosensitive compositions are employed as part of an imageable element such as a lithographic printing plate. Accordingly, it is an object of this invention to provide this novel fluorinated aromatic acetal polymer. It is another object of this invention to provide a method of preparing such a fluorinated aromatic acetal polymer. It is yet another object of this invention to provide a photosensitive composition comprising at least one diazo resin and at least one such fluorinated aromatic acetal polymer of this invention. It is yet another object of this invention to provide a method of preparing such a photosensitive composition. It is yet another object of this invention to provide an imageable member comprising a support and a photosensitive composition of this invention.

SUMMARY OF THE INVENTION

The fluorinated aromatic acetal polymer composition of this invention comprises at least one unit of A and at least one unit of either B or C, or at least one unit of each of A, B and C, and optionally further comprises at least one unit of either D or E, or at least one unit of each of D and E, wherein the units are linked together by single covalent C—C bonds and have the formulae:

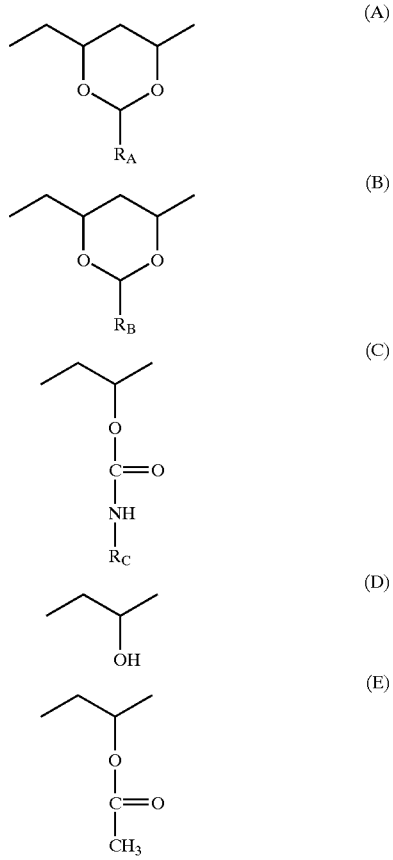

where A, B, C, D and E are present in the corresponding ratio $n_1:n_2: n_{3;n_4}:n_5$, where $n_1$=10–80 mole %; $n_2$=0–65 mole %; $n_3$=0–65 mole %; $n_4$=0–50 mole %; $n_5$=0–20 mole %; $R_A$ is H or a $C_1$–$C_{11}$ alkyl group, or an aryl group that does not contain fluorine, and $R_B$ and $R_C$ are aryl groups that contain fluorine, including (trifluoromethyl) phenyl and fluorophenyl groups. Here an aryl group is defined as any group obtained from an aromatic compound by removing one of the hydrogen atoms attached to an aromatic carbon atom.

In one preferred embodiment, the unit B has the formula:

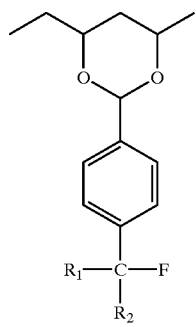

where each of $R_1$ and $R_2$ is independently F, H, or an alkyl group. The fluorinated aromatic acetal polymer composition is preferably prepared by the process comprising reacting a hydrolyzed polyvinyl acetate polymer or copolymer with at least one non-fluorinated aldehyde component, and at least one fluorinated aromatic component.

The photosensitive composition of this invention comprises at least one diazo resin, and at least one fluorinated aromatic acetal polymer composition as described above. The imageable member of this invention comprises a support and the photosensitive composition as described above applied to the support. In a particularly preferred embodiment, the imageable member of this invention is used as a lithographic printing plate precursor, and upon imaging is used as a lithographic printing plate.

DETAILED DESCRIPTION OF THE INVENTION

The fluorinated aromatic acetal polymer composition of this invention comprises at least one unit of A and at least one unit of either B or C or at least one unit of each of A, B and C, and may further comprise at least one unit of either D or E, or at least one unit of each of D and E, wherein the units are linked together by single covalent C—C bonds and have the formulae:

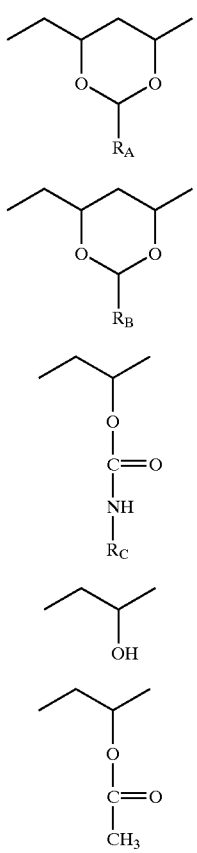

where A, B, C, D and E are present in the corresponding ratio $n_1:n_2:n_3:n_4:n_5$, where $n_1$=10–80 mole %, $n_2$=0–65 mole %, $n_3$=0–65 mole %, $n_4$=0–50 mole % $n_5$=0–20 mole %, $R_A$ is H or a $C_1$–$C_{11}$ alkyl group, or an aryl group that does not contain fluorine, and $R_B$ and $R_C$ are aryl groups that contain fluorine, including (trifluoromethyl) phenyl and p-fluorophenyl groups. The non-fluorinated alkyl and aryl groups may be substituted or unsubstituted. Aralkyl groups are particularly preferred.

In a preferred embodiment, and unit B has the formula:

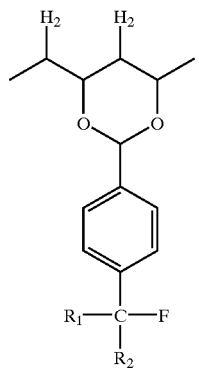

where each of $R_1$ and $R_2$ is independently F, H or an alkyl group. In a particularly preferred embodiment, $R_1$ and $R_2$ are each F.

In a preferred embodiment, the composition of the invention further comprises at least one acid group having a pKa equal to or less than 11. The acid group is preferably a carboxylic acid group and most preferably is derived from a carboxybenzaldehyde. The composition preferably further comprises at least one photopolymerizable ethylenically unsaturated group, at least one photocrosslinkable group, or a combination thereof.

The fluorinated aromatic acetal polymer composition of this invention is preferably prepared by the process comprising reacting a hydrolyzed polyvinyl acetate polymer or copolymer with at least one non-fluorinated aldehyde component and at least one fluorinated aromatic component. The term aldehyde component includes aldehyde derivatives such as acetals. The reaction conditions which may be used are those that will be well known and understood by those skilled in the art for reacting such components. For example, the components may be reacted at temperatures in the range of from ambient to about 150° C., preferably from about 40° C. to about 100° C., for a period of time ranging from about 30 minutes to about 24 hours, preferably about 2 hours to about 8 hours. Relative to the hydrolyzed polyvinyl acetate polymer or copolymer, the non-fluorinated aldehyde components may be reacted in amounts from about 10 to about 80 mole %; the fluorinated components may be reacted in amounts of from about 5 to about 65 mole %.

In a preferred embodiment, the hydrolyzed polyvinyl acetate polymer or copolymer is prepared as follows. Vinyl acetate is polymerized, or copolymerized with other monomers, to produce a polyvinyl acetate polymer or copolymer. The weight average molecular weight ($M_w$) of the polyvinyl acetate polymer or copolymer is about 20,000 to about 130,000 g/mole, preferably about 35,000 to about 130,000 g/mole. Vinyl alcohol groups are then produced by hydrolysis of the acetate groups. Acetate groups are hydrolyzed to the extent of about 70–98 mole %, preferably about 80–98 mole %. Other monomers useful in making a copolymer include vinyl esters of $C_3$–$C_{22}$ carboxylic acids having linear or branched chains and acid-functional monomers, such as crotonic acid.

In a preferred embodiment, the non-fluorinated aldehyde component is selected from the group consisting of at least one of an aliphatic aldehyde, an aromatic aldehyde, an aralkylaldehyde, and a carboxyl-functional aldehyde. In a particularly preferred embodiment, the non-fluorinated aldehyde component is propionaldehyde.

In a preferred embodiment, the fluorinated aromatic component comprises at least one fluoro group, at least one trifluoromethyl group or at least one trifluoromethoxy group attached to the aromatic ring.

In another preferred embodiment, the fluorinated aromatic component is selected from the group consisting of one or more of: 4-fluorophenyl isocyanate; 4-fluorobenzaldehyde; 2,3-difluorobenzaldehyde; 2,4-difluorobenzaldehyde; 2,5-difluorobenzaldehyde; 2,6-difluorobenzaldehyde; 3,4-difluorobenzaldehyde; 3,5-difluorobenzaldehyde; 2,3,4-trifluorobenzaldehyde; 2,3,5,6-tetrafluorobenzaldehyde; pentafluorobenzaldehyde; p-trifluoromethylbenzaldehyde; m-(trifluoromethyl)benzaldehyde, m-(trifluoromethyl)phenyl isocyanate, p-(trifluoromethyl)phenyl isocyanate, 3,5-bis(trifluoromethyl)phenyl isocyanate, 4-(trifluoromethoxy)phenyl isocyanate, 2-chloro-5-(trifluoromethyl)phenyl isocyanate. In a particularly preferred embodiment, the fluorinated aromatic component is p-trifluoromethylbenzaldehyde.

The photosensitive composition of this invention comprises : (1) at least one diazo resin; and (2) at least one fluorinated aromatic acetal polymer composition according to this invention, as described above.

The diazo resin or resins used in the photosensitive composition of this invention may be any diazo resin or resins known to be useful in photosensitive compositions or imaging members such as lithographic printing plates. These include, for example, the condensation product of p-diazo diphenyl amine and paraformaldehyde, the condensation product of 3-methoxy-4-diazo diphenylamine and paraforrnaldchyde, and the diazo resins of U.S. Pat. Nos. 2,063,631; 2,667,415; 2,667,498; 2,922,715; 2,946,683; 3,050,502; 3,163,633; 3,227,074; 3,311,605; 3,406,159; 3,679,419; 3,849,392; and 3,867,147.

The diazo resin is typically employed in an amount of about 10 to about 60 percent by weight of the photosensitive composition, more preferably in an amount of about 20 to about 40 percent by weight. The fluorinated aromatic acetal polymer is typically employed in an amount of about 10 to about 70 percent by weight of the photosensitive composition, more preferably in an amount of about 20 to about 65 percent by weight.

In addition to a diazo resin and the fluorinated aromatic acetal polymer, the photosensitive composition may optionally contain a variety of other ingredients such as colorants, stabilizers, exposure indicators and surfactants. Particularly useful colorants are pigments, including phthalocyanine, anthraquinone and quinacridone pigments. Useful amounts of pigment are from about 1 to about 20 percent by weight of the photosensitive composition, more preferably from about 2 to about 12 percent by weight and most preferably from about 4 to about 8 percent by weight. Effective stabilizers include both organic and inorganic acids, preferably citric, phosphoric, ascorbic, oxalic or tartaric acids. Useful amounts of acid are from about 2 to about 6 percent by weight of the photosensitive composition, more preferably from about 2.5 to about 5 percent by weight, and most preferably from about 3 to about 4 percent by weight. Useful exposure indicators are dyes which are pH sensitive and which do not couple with diazonium compounds. Examples of such dyes include eosin, azobenzene, Victoria Blue, 4-phenylazo diphenylamine, methyl violet and phenolphthalein. Useful amounts of the dye are from about 0.01 to about 3 percent by weight of the photosensitive composition, more preferably from about 0.05 to about 2 percent by weight, and most preferably from about 0.1 to about 1 percent by weight. Useful surfactants include fluorocarbon surfactants, and silicone surfactants. The surfactant is used in an amount of from about 0.005 to about 6 percent weight of the photosensitive composition, more preferably in an amount less than about 2 percent by weight, and most preferably less than about 1 percent by weight.

In a particularly preferred embodiment, the diazo resin used in the photosensitive composition of this invention comprises a condensation product of 3-methoxy-4-diazodiphenylamine sulfate and methoxymethyl-substituted diphenyl ether and salts thereof.

The fluorinated aromatic acetal polymer may advantageously contain photopolymerizable ethylenically unsaturated groups, photocrosslinkable groups or combinations thereof. For this embodiment, in addition to a diazo resin, it is advantageous that the photosensitive composition further comprises a photoinitiator, or photosensitizer or combination thereof in order to facilitate photopolymerization or photocrosslinking of the reactive groups.

Such diazo photopolymer hybrid compositions are well known in the art, as described in U.S. Pat. No. 4,687,727 and U.S. Pat. No. 4,845,009 the disclosures of which are incorporated herein by reference. U.S. Pat. No. 4,687,727 describes photosensitive hybrid compositions containing diazo resins together with photopolymerizable (meth) acrylated resins. Photopolymerizable (meth) acrylate groups can be incorporated into the fluorinated aromatic acetal polymers by various known methods, including reaction with compounds containing both an isocyanate group and a methacrylate group, such as 2-isocyanatoethyl methacrylate. Reaction of the isocyanate group with a hydroxy group on the polymer results in the introduction of photopolymerizable methacrylate groups.

In a similar manner, reaction of the isocyanate group of m-isopropenyl-α, α-dimethyl, benzyl isocyanate (m-TMI, available from Cytec Corp) with a hydroxy group on the fluorinated aromatic acetal polymer results in the introduction of photopolymerizable isopropenyl groups. Photoreactivity of these compositions is enhanced by the addition of one or more photoinitiators for free radical polymerization, which are well known in the art. Further enhancement in photoreactivity may be achieved by the addition of (meth) acrylated monomers and oligomers, which may copolymerize with the photoreactive fluorinated aromatic acetal polymers.

U.S. Pat. No. 4,845,009 describes photosensitive hybrid compositions containing diazo resins together with polymers containing photocrosslinkable dimethylmaleimide groups. In this case, photoreactivity is enhanced by the addition of photosensitizers, notably thioxanthone derivatives. Photocrosslinkable dimethylmaleimide groups can be incorporated into the fluorinated aromatic acetal polymers by various known methods, including reaction with compounds containing both a dimethylmaleimide group and an aldehyde group or aldehyde derivative, such as an acetal. Examples of such compounds, which contain both dimethylmaleimide groups and acetal groups, as well as their reaction with polyvinyl acetals, are described in U.S. Pat. No. 6,087,066, which is incorporated herein by reference.

In such diazo photopolymer hybrid compositions, the diazo resin is used in amounts of from about 1 to about 18 weight percent, preferably from about 2 to about 10 weight percent. The acetal polymer is used in amounts of about 10 to about 70 weight percent of the photosensitive composition, preferably from about 20 to about 65 weight percent.

The imageable member of this invention comprises a support and the photosensitive composition of this invention which is applied to the support. The photosensitive composition is coated onto the support by coating methods well known to those skilled in the art, such as roll coating, gravure coating, spin-coating or whirling. Roll coating and gravure coating are particularly preferred. Methods known to those of skilled in the art used for coating supports with imageable or photosensitive compositions, such as those described in European Patent Application EP 909 657 (incorporated herein by reference), may be used.

For the preparation of printing plates, such as lithographic printing plates, the photosensitive composition is applied, preferably by coating techniques, onto a suitable support such as a metal, polymeric film, ceramic, or polymeric-coated paper using conventional procedures and equipment. Suitable metals include aluminum, zinc or steel, but preferably, the metal is aluminum. A most preferred support is a mechanically and electrochemically grained (multi-grained) and sulfuric acid anodized aluminum sheet. Such elements are generally known as lithographic printing plate precursors, but other useful elements include printed circuit boards. Typically, an aluminum substrate is first grained by brushing in dry condition, by brushing with an abrasive suspension, by electrochemical graining, for example in a hydrochloric acid electrolyte or combinations thereof (multi-grain). The grained plates, which optionally have been subjected to an anodic oxidation in sulfuric or phosphoric acid, are then subjected to a hydrophilizing treatment, preferably in aqueous solutions of polyvinyl phosphonic acid or phosphoric acid. Such substrate pretreatments are well known to those of skill in the art. The plate may also be post anodically treated with materials such as silicate.

The imageable member of this invention may be imaged by exposure to suitable electromagnetic radiation, as is well understood by those of ordinary skill in the art. For example, the imageable member may be imaged using radiation in the UV to IR range. The imageable member may also be imaged using "computer-to-plate" (CTP) imaging applications. Such systems utilize digitized image formation, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the imageable member of this invention.

Laser imaging may be carried out using any moderate or high-intensity laser diode writing device. During operation, the element to be exposed may be placed in the retaining mechanism of the writing device and the write beam scanned across the element to generate an image. A laser printing apparatus may be used that includes a mechanism for scanning the write beam across the element.

This invention is further illustrated by the following examples of its practice.

EXAMPLE 1

A polyvinyl acetal polymer, which contains vinyl alcohol, vinyl acetate, propionaldehyde acetal, o-formylbenzoic acid acetal and p-(trifluoromethyl) benzaldehyde acetal units in the approximate ratio of 10, 10, 40, 20 and 20 mol %, respectively, based on the reactants, was prepared from Airvol 203, a hydrolyzed polyvinyl acetal polymer (about 90 mol % hydrolyzed), available from Air Products (Allentown, Pa.) as follows. Airvol 203 (33.5 g) was added to a round bottom flask containing water (100 g) and 1-propanol (200 g). The contents were stirred and heated at 75° C. for 1 hour and allowed to stand overnight at room temperature. The contents were reheated to 60° C. followed by the addition of concentrated hydrochloric acid (4.6 g) and p-(trifluoromethyl) benzaldehyde (13.2 g.). The reaction was allowed to proceed for 1 hour at 60° C., followed by the addition of 2-formylbenzoic acid (11.4 g). After one hour, propionaldehyde (8.8 g) was added and the reaction was allowed to proceed for an additional hour, followed by cooling and precipitation of the polymer by addition of water. The polymer was filtered, washed with water and dried at 40° C. for about 18 hours.

This polyvinyl acetal, which contains trifluoromethyl groups, was formulated into a photosensitive composition together with diazo resin P533/M (a condensation product of 3-methoxy-4-diazodiphenylamine sulfate and an isomeric mixture of methoxymethyl-substituted diphenylethers, isolated as the mesitylene sulfonate salt, available from Diversitec Corp., Fort Collins, Colo.), pigment dispersion (phthalocyanine blue (60 wt %) and Butvar B-98 (40 wt %, a polyvinyl acetal, available from Solutia, St. Louis, Mo.) and metanil yellow dye (acid yellow 36). The polyvinyl acetal, diazo resin, pigment dispersion and dye (35.7, 36.4, 25.6 and 2.33 wt %, respectively) were formulated into a solution of 2-methoxyethanol, 2-ethoxyethanol and dimethylformamide (61.8: 27.6: 10.6 wt %) at 5.31 % solids and applied to a lithographic aluminum plate substrate to provide an imageable member with a coating weight of 0.75 g/m$^2$. Prior to application of the coating, the aluminum substrate was mechanically and electrochemically grained aluminum plate, anodized in sulfuric acid and post anodically treated with silicate.

EXAMPLE 2 (Comparative)

A polyvinyl acetal polymer, which contains vinyl alcohol, vinyl acetate, propionaldehyde acetal and o-formylbenzoic acid acetal units in the approximate ratio of 10, 10, 55 and 25 mol respectively, based on the reactants, was prepared from Airvol 203, isolated, formulated into a photosensitive composition and applied to a lithographic aluminum plate substrate to provide an imageable member, in accordance with the procedures in Example 1.

EXAMPLE 3

Each of the imageable members of Example 1 and 2 were imagewise exposed with a suitable radiation source, developed, using a Kodak Polychrome Graphics (Norwalk, Conn.) SN-32 negative plate processor and SP negative plate developer, and run on a Didde Glazer web press. The plates were examined after each 10,000 impressions and were cleaned with A240 press wash (Anchor Lith-Kem-Ko, Orange Park, Fla.), followed by treatment with Kodak Polychrome Graphics plate cleaner and reconditioner. As measures of plate wear, the minimum dot size (%) and the minimum microline size (in $\mu$m) vs. number of impressions were determined for each plate. The printing plate of Example 1, which contains the fluorinated aromatic acetal polymer, retained acceptable dots and microlines for more than 150,000 impressions. In contrast, the printing plate of Example 2, which does not contain the fluorinated aromatic acetal polymer, exhibited unacceptable dots and microlines after about 50,000 impressions.

In accordance with the above results, the solid steps of the plate of Example 2 were found to wear substantially faster than those of Example 1, which contain the fluorinated aromatic acetal polymer. Linear regression analysis was also performed on the first solid step as a function of number of impressions. Since the solid steps decrease as the run progresses, the slope of the arithmetic line is negative. The larger the slope, the faster the plate wear and the poorer the run length. As shown in the Table below, the slope for the printing plate of Example 1 is substantially smaller, by a factor of approximately three, than that of Example 2, corresponding to improved run length of Example 1, which contains the fluorinated aromatic acetal polymer. The values in the table are stated as steps per thousand impressions, together with standard deviations.

| Example | Slope for Solid Step Change | Std. Dev. |
| --- | --- | --- |
| 1 | −0.048 | ±0.004 |
| 2 | −0.140 | ±0.019 |

EXAMPLE 4

A polyvinyl acetal polymer, which contains vinyl alcohol, vinyl acetate, propionaldehyde acetal, 3-phenylbutyraldehyde acetal, o-formylbenzoic acid acetal and p-(trifluoromethyl) benzaldehyde acetal units in the approximate ratio of 12, 10, 24, 15, 24 and 15 mol %, respectively, based on the reactants, was prepared from Airvol 203, isolated, formulated into a photosensitive composition and applied to a lithographic aluminum plate substrate to provide an imageable member, in accordance with the procedures in Example 1.

EXAMPLE 5 (Comparative)

A polyvinyl acetal polymer, which contains vinyl alcohol, vinyl acetate, propionaldehyde acetal, 3-phenylbutyraldehyde acetal and o-formylbenzoic acid acetal units in the approximate ratio of 10, 10, 10, 50 and 20 mol %, respectively, based on the reactants, was prepared from Airvol 203, isolated, formulated into a photosensitive composition and applied to a lithographic aluminum plate substrate to provide an imageable member, in accordance with the procedures in Example 1.

EXAMPLE 6

A polyvinyl acetal polymer, which contains vinyl alcohol, vinyl acetate, propionaldehyde acetal, o-formylbenzoic acid acetal and p-fluorobenzaldehyde acetal units in the approximate ratio of 10, 10, 10, 20 and 50 mol %, respectively, based on the reactants, was prepared from Airvol 203, isolated, formulated into a photosensitive composition and applied to a lithographic aluminum plate substrate to provide an imageable member, in accordance with the procedures in Example 1.

EXAMPLE 7

A polyvinyl acetal polymer, which contains vinyl alcohol, vinyl acetate, propionaldehyde acetal, o-formylbenzoic acid acetal and pentafluorobenzaldehyde acetal units in the approximate ratio of 10, 10, 40, 20 and 20 mol %, respectively, based on the reactants, was prepared from Airvol 203, isolated, formulated into a photosensitive composition and applied to a lithographic aluminum plate substrate to provide an imageable member, in accordance with the procedures in Example 1.

EXAMPLE 8

A polyvinyl acetal polymer, which contains vinyl alcohol, vinyl acetate, propionaldehyde acetal, o-formnylbenzoic acid acetal and 3,5-bis (trifluoromethyl) benzaldehyde acetal units in the approximate ratio of 10, 10, 40, 20 and 20 mol %, respectively, based on the reactants, was prepared from Airvol 203, isolated, formulated into a photosensitive composition and applied to a lithographic aluminum plate substrate to provide an imageable member, in accordance with the procedures in Example 1.

EXAMPLE 9

A polyvinyl acetal polymer, which contains vinyl alcohol, vinyl acetate, propionaldehyde acetal and o-formylbenzoic acid acetal units was prepared from Airvol 203 and isolated in accordance with the procedure of Example 1. The dried polymer was further reacted with m-(trifluoromethyl) phenyl isocyanate in methyl ethyl ketone, using dibutyl tin dilaurate as catalyst, to provide a fluorine-substituted polyvinyl acetal, which contains vinyl alcohol, vinyl acetate, propionaldehyde acetal, o-formylbenzoic acid acetal and m-(trifluoromethyl) phenyl urethane units in the approximate ratio of 5, 10, 45, 30 and 20 mol %, respectively, based on the proportions of reactants. The polymer, which was isolated by precipitation and dried in vacuum, was formulated into a photosensitive composition and applied to a lithographic aluminum plate substrate to provide an imageable member, in accordance with the procedures in Example 1.

EXAMPLE 10

A polyvinyl acetal polymer, which contains vinyl alcohol, vinyl acetate, butyraldehyde acetal, p-toluenesulfonyl urethane and m-(trifluoromethyl) phenyl urethane units in the approximate ratio of 3, 5, 75, 3 and 14 mol %, respectively, based on the reactants, was prepared from Mowital B20H (a polyvinyl butyral, available from Hoechst), by reaction with p-toluenesulfonyl isocyanate and m-(trifluoromethyl) phenyl isocyanate in the appropriate proportions in methyl ethyl ketone, using dibutyl tin dilaurate as catalyst. The polymer was isolated by precipitation, dried in vacuum, formulated into a photosensitive composition and applied to a lithographic aluminum plate substrate to provide an imageable member, in accordance with the procedures in example 9.

EXAMPLE 11

A polyvinyl acetal polymer, which contains vinyl alcohol, vinyl acetate, butyraldehyde acetal, maleic acid ester and m-(trifluoromethyl) phenyl urethane units in the approximate ratio of 3, 5, 75, 4 and 13 mol %, respectively, based on the proportion of reactants, was prepared from Mowital B20H, by reaction with m-(trifluoromethyl) phenyl isocyanate, followed by reaction with maleic anhydride, using triethylamine as catalyst. The polymer was isolated by precipitation, dried in vacuum, formulated into a photosensitive composition and applied to a lithographic aluminum plate substrate to provide an imageable member, in accordance with the procedures in Example 9.

EXAMPLE 12

A polyvinyl acetal polymer, which contains vinyl alcohol, vinyl acetate, propionaldehyde acetal, o-formylbenzoic acid acetal and p- (trifluoromethyl) benzaldehyde acetal units was prepared from Airvol 203 and isolated in accordance with the procedure of Example 1. The dried polymer was further reacted with 2-isocyanatoethyl methacrylate (IEMA) in methyl ethyl ketone, using dibutyl tin dilaurate as catalyst, to provide a methacrylate-functional polyvinyl acetal, which contains vinyl alcohol, vinyl acetate, propionaldehyde acetal, o-formylbenzoic acid acetal, p- (trifluoromethyl) benzaldehyde acetal and methacrylated urethane units, derived from reaction of IEMA with vinyl alcohol units, in the approximate ratio of 10, 10, 20, 15, 25 and 20 mol %, respectively, based on the proportions of reactants.

The polymer, which was isolated by precipitation and dried in vacuum, was formulated into a photosensitive composition and applied to a lithographic aluminum plate substrate to provide an imageable member, in accordance with the procedures in Example 1, except that the formulation included a mixture of photoinitiators, 2-methyl-1-[4-(methylthiophenyl]-2-morpholinopropanone (available from Ciba Specialty Chemicals as Irgacure 907) and 4,4-bis-dimethylamino] benzophenone (EMK), for free radical polymerization. The diazo-photopolymer hybrid formulation contained the methacrylated polyvinyl acetal, diazo resin, pigment dispersion, dye, Irgacure 907 and EMK at 55.5, 8.2, 15.1, 2.4, 13.3 and 5.3 wt %, respectively.

EXAMPLE 13

The imageable members of Examples 1–12 were evaluated for their resistance to Kodak Polychrome Graphics plate cleaner and reconditioner as a measure of their press durability and press life. Examples 1, 3, 4, 6–12, which contain fluorine-substituted polyvinyl acetals, exhibited good to excellent plate cleaner resistance. Whereas, Examples 2 and 5, which do not contain fluorine-substituted polyvinyl acetals, exhibited poor to fair plate cleaner resistance.

The invention claimed is:

1. A fluorinated aromatic acetal polymer composition comprising at least one unit of A and at least one unit of either B or C, or at least one unit of each of A, B and C wherein the units A and B or C are linked together by single covalent C—C bonds and have the

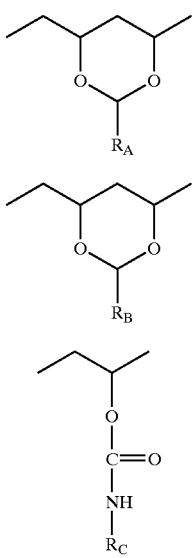

formulae:

wherein $R_A$ is H, a $C_1$–$C_{11}$ alkyl group, or an aryl or group that does not contain fluorine, and $R_B$ and $R_C$ are aryl groups that contain fluorine.

2. The composition of claim 1 wherein: A and B and C are present in the corresponding ratio $n_1$:$n_2$:$n_3$, where $n_1$=10–80 mole %, $n_2$=0–65 mole %, and $n_3$=0–65 mole %.

3. The composition of claim 1 further comprising at least one unit of either D or E, or at least one unit of each of D and E, wherein the units of A and B and/or C and D and/or E are linked together by single covalent C—C bonds, and wherein D and E have the formulae:

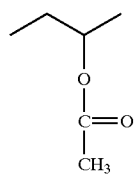

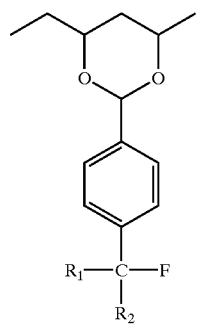

4. The composition of claim 3 wherein D and E are present in the corresponding ratio $n_4$:$n_5$ wherein $n_4$=0–50 mole % and $n_5$=0–20 mole %.

5. The composition of claim 1, comprising at least one unit of A and at least one unit of B wherein unit B has the formula:

where each of $R_1$ and $R_2$ is independently F, H or an alkyl group.

6. The composition of claim 5, wherein $R_1$ and $R_2$ are each F.

7. The composition of claim 1 further comprising at least one acid group having a pKa equal to or less than 11.

8. The composition of claim 1 further comprising at least one of a photopolymerizable ethylenically unsaturated group and a photocrosslinkable group.

9. The composition of claim 1 wherein $R_A$ is an aralkyl group that does not contain fluorine.

10. A method of preparing a fluorinated aromatic acetal polymer composition comprising reacting a hydrolyzed polyvinyl acetate polymer or copolymer with at least one non-fluorinated aldehyde component, and at least one fluorinated aromatic component.

11. The method of claim 10, wherein the fluorinated aromatic component is selected from the group consisting of one or more of: 4-fluorophenyl isocyanate; 4-fluorobenzaldehyde; 2,3-difluorobenzaldehyde; 2,4-difluorobenzaldehyde; 2,5-difluorobenzaldehyde; 2,6-difluorobenzaldehyde; 3,4-difluorobenzaldehyde; 3,5-difluorobenzaldehyde; 2,3,4-trifluorobenzaldehyde; 2,3,5,6-tetrafluorobenzaldehyde; pentafluorobenzaldehyde; p-trifluoromethylbenzaldehyde; m-(trifluorometh.yl) benzaldehyde; m-(trifluoromethyl)phenyl isocyanate; p-(trifluoromethyl)phenyl isocyanate; 3,5-bis (trifluoromethyl)phenyl isocyanate; 4-(trifluoromethoxy) phenyl isocyanate; and 2-chloro-5-(trifluoromethyl)phenyl isocyanate.

12. The method of claim 10, wherein the fluorinated aromatic component is p-trifluoromethyl benzaldehyde.

13. The method of claim 10, wherein the non-fluorinated aldehyde component is selected from the group consisting of at least one of an aliphatic aldehyde, an aromatic aldehyde, an aralkylaldehyde and a carboxyl-functional aldehyde.

14. A fluorinated aromatic acetal polymer composition comprising the reaction product of a hydrolyzed polyvinyl acetate polymer or copolymer, at least one non-fluorinated aldehyde component, and at least one fluorinated aromatic component.

15. A photosensitive composition comprising: (1) at least one diazo resin; and (2) at least one fluorinated aromatic acetal polymer composition comprising at least one unit of A and at least one unit of either B or C or at least one unit of each of A, B and C, wherein units A and B and/or C are linked together by single covalent C—C bonds and have the formulae:

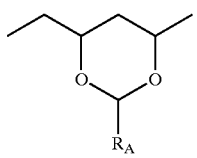

(A)

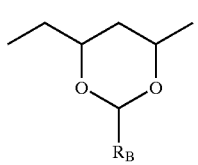

(B)

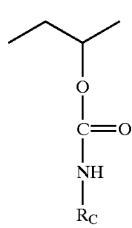

(C)

wherein $R_A$ is H or $C_1$–$C_{11}$ alkyl, or an aryl group that does not contain fluorine, and $R_B$ and $R_C$ are aryl groups that contain fluorine.

16. The composition of claim 15 further comprising at least one unit of either D or E, or at least one unit of each of D and E, wherein D and E have the formulae:

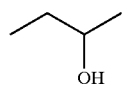

(D)

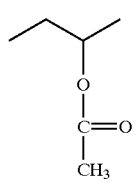

(E)

17. The photosensitive composition of claim 15, wherein the fluorinated aromatic acetal polymer composition comprises at least one unit of A and at least one unit of B and unit B has the formula:

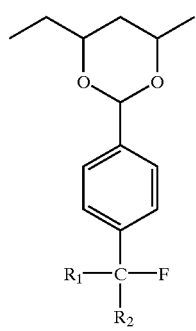

where each of $R_1$ and $R_2$ is independently F, H or an alkyl group.

18. The photosensitive composition of claim 17, wherein $R_1$ and $R_2$ are each F.

19. The photosensitive composition of claim 15, wherein the diazo resin comprises a condensation product of 3-methoxy-4-diazodiphenylamine sulfate and methoxymethyl-substituted diphenyl ether and salts thereof.

20. The photosensitive composition of claim 15 wherein $R_A$ is an aralkyl group that does not contain fluorine.

21. The photosensitive composition of claim 15 further comprising at least one selected from the group consisting of photoinitiator, photosensitizer and combinations thereof.

22. An imageable member comprising: (a) a support; and (b) a photosensitive composition applied to the support, wherein the photosensitive composition comprises: (1) at least one diazo resin; and (2) at least one fluorinated aromatic acetal polymer composition comprising at least one unit of A and at least one unit of either B or C or at least one unit of each of A, B and C wherein units A and B and/or C are linked together by single covalent C—C bonds and have the formulae:

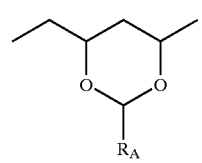

(A)

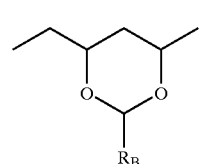

(B)

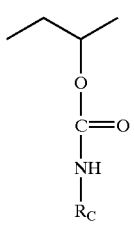

(C)

wherein $R_A$ is H or $C_1$–$C_{11}$ alkyl, or an aryl group that does not contain fluorine and $R_B$ and $R_C$ are aryl groups that contain fluorine.

23. The member of claim 22 wherein the acetyl polymer composition further comprises at least one unit of either D or E, or at least one unit of each of D and E, wherein D and E have the formulae:

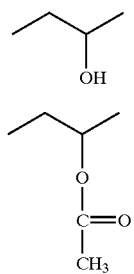

(D)

(E)

24. The member of claim 22, wherein the fluorinated aromatic acetal polymer composition comprises at least one unit of A and at least one unit of B and unit B has the formula:

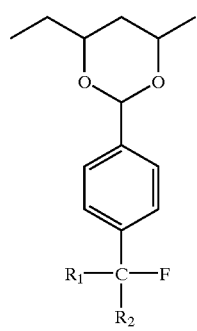

where each of $R_1$ and $R_2$ is independently F, H or an alkyl group.

25. The member of claim 24, wherein $R_1$ and $R_2$ are each F.

26. The member of claim 22, wherein the diazo resin comprises a condensation product of 3-methoxy-4-diazodiphenylamine sulfate and methoxymethyl-substituted diphenyl ether and salts thereof.

27. The member of claim 22 wherein the photosensitive composition further comprises at least one selected from the group consisting of photoinitiator, photosensitizer and combinations thereof.

28. The member of claim 22 wherein $R_A$ is an aralkyl group that does not contain fluorine.

* * * * *